US009556535B2

(12) United States Patent
Pernot et al.

(10) Patent No.: US 9,556,535 B2
(45) Date of Patent: Jan. 31, 2017

(54) TEMPLATE FOR EPITAXIAL GROWTH, METHOD FOR PRODUCING THE SAME, AND NITRIDE SEMICONDUCTOR DEVICE

(71) Applicant: SOKO KAGAKU CO., LTD., Aichi (JP)

(72) Inventors: Cyril Pernot, Aichi (JP); Akira Hirano, Aichi (JP)

(73) Assignee: Soko Kagaku Co., Ltd., Aichi (JP)

( * ) Notice: Subject to any disclaimer, the term of this patent is extended or adjusted under 35 U.S.C. 154(b) by 0 days.

(21) Appl. No.: 14/765,884

(22) PCT Filed: Aug. 29, 2014

(86) PCT No.: PCT/JP2014/072701
§ 371 (c)(1),
(2) Date: Aug. 5, 2015

(87) PCT Pub. No.: WO2016/031039
PCT Pub. Date: Mar. 3, 2016

(65) Prior Publication Data
US 2016/0265138 A1    Sep. 15, 2016

(51) Int. Cl.
*H01L 33/00*    (2010.01)
*C30B 25/18*    (2006.01)
(Continued)

(52) U.S. Cl.
CPC ............ *C30B 25/183* (2013.01); *C30B 29/38* (2013.01); *C30B 29/406* (2013.01); *C30B 31/08* (2013.01);
(Continued)

(58) Field of Classification Search
CPC ........ H01L 33/007; H01L 33/06; H01L 33/12; H01L 33/32; H01L 33/145; C30B 25/183; C30B 25/16; C30B 25/04; C30B 29/406; C30B 29/403; C30B 29/40; C30B 31/08; H01S 5/32341; H01S 5/0213; H01S 2304/04
See application file for complete search history.

(56) References Cited

U.S. PATENT DOCUMENTS 6,426,519 B1    7/2002 Asai et al.
2008/0233721 A1    9/2008 Kosaka et al.
(Continued)

FOREIGN PATENT DOCUMENTS

JP    3455512 B2    10/2003
JP    2008235769 A    10/2008
(Continued)

OTHER PUBLICATIONS

Hirayama, et al., "222-282 nm AlGaN and InAlGaN-based deep-UV LEDs fabrication on high-quality AlN on sapphire," Phys. Status Solidi A 206, No. 6, Mar. 25, 2009, 1176-1182.
(Continued)

*Primary Examiner* — Nikolay Yushin
(74) *Attorney, Agent, or Firm* — James F. Hann; Haynes Beffell & Wolfeld LLP

(57) ABSTRACT

The present invention provides a method for producing a template for epitaxial growth, the method including: a surface treatment step of dispersing Ga atoms on a surface of a sapphire substrate; and an AlN growth step of epitaxially growing an AlN layer on the sapphire substrate, wherein in a Ga concentration distribution in a depth direction perpendicular to the surface of the sapphire substrate in an internal region of the AlN layer excluding a near-surface region up to a depth of 100 nm from the surface of the AlN layer, which is obtained by secondary ion mass spectrometry, a position in the depth direction where the Ga concentration takes the maximum value is present in a near-interface region located between the interface of the sapphire substrate and a position at 400 nm spaced apart
(Continued)

from the interface to the AlN layer side, and the maximum value of the Ga concentration is $3 \times 10^{17}$ atoms/cm$^3$ or more and $2 \times 10^{20}$ atoms/cm$^3$ or less.

12 Claims, 7 Drawing Sheets

(51) Int. Cl.

| | |
|---|---|
| C30B 29/38 | (2006.01) |
| H01L 21/20 | (2006.01) |
| H01L 21/205 | (2006.01) |
| H01L 33/32 | (2010.01) |
| C30B 29/40 | (2006.01) |
| C30B 31/08 | (2006.01) |
| H01L 33/06 | (2010.01) |
| H01L 33/12 | (2010.01) |
| H01L 33/14 | (2010.01) |
| H01S 5/02 | (2006.01) |
| H01S 5/323 | (2006.01) |

(52) U.S. Cl.
CPC ............ *H01L 21/20* (2013.01); *H01L 21/205* (2013.01); *H01L 33/007* (2013.01); *H01L 33/06* (2013.01); *H01L 33/12* (2013.01); *H01L 33/145* (2013.01); *H01L 33/32* (2013.01); *H01S 5/0213* (2013.01); *H01S 5/32341* (2013.01); *H01S 2304/04* (2013.01)

(56) References Cited

U.S. PATENT DOCUMENTS

| | | |
|---|---|---|
| 2008/0242060 A1 | 10/2008 | Kosaka et al. |
| 2010/0219395 A1 | 9/2010 | Hirayama et al. |

FOREIGN PATENT DOCUMENTS

| | | |
|---|---|---|
| JP | 2008251643 A | 10/2008 |
| JP | 2010205767 A | 9/2010 |

OTHER PUBLICATIONS

Mei et al., "Dislocation generation at the coalescence of aluminum nitride lateral epitaxy on shallow-grooved sapphire substrates," Appl. Phys. Lett. 90, Jul. 24, 2007, 3 pages.

Nagamatsu, et al., "High-efficiency AlGaN-based UV light-emitting diode on laterally overgrown AlN," J. of Crystal Growth 310, Jan. 8, 2008, 2326-2329.

Nakano, et al., "Epitaxial lateral overgrowth of AlN layers on patterned sapphire substrates," Phys. Stat. Sol. (a) 203, No. 7, May 22, 2006, 1632-1635.

Fig. 4

| Sample | Production method | Presence of cracks (Quality: Good/Poor) | XRC-FWHM (arcsec) | | Maximum value of Ga concentration (atoms/cm$^3$) | |
|---|---|---|---|---|---|---|
| | | | Tilt | Twist | Internal region of AlN layer | Near-interface region |
| #11 | First production method | No(Good) | 65 | 544 | | |
| #12 | First production method | No(Good) | 45 | 573 | | |
| #13 | First production method | No(Good) | 54 | 545 | | |
| #14 | First production method | No(Good) | 45 | 550 | | |
| #15 | First production method | No(Good) | 53 | 624 | $8.54 \times 10^{17}$ | $8.54 \times 10^{17}$ |
| #16 | First similar production method | Yes(Poor) | 45 | 802 | | |
| #17 | First similar production method | Yes(Poor) | 76 | 625 | $2.42 \times 10^{17}$ | $2.38 \times 10^{17}$ |
| #21 | Second production method | No(Good) | 54 | 532 | | |
| #22 | Second similar production method | Yes(Poor) | 424 | 2163 | | |
| #23 | Second similar production method | Yes(Poor) | 82 | 811 | | |
| #31 | Third production method | No(Good) | 49 | 546 | | |
| #32 | Third production method | No(Good) | 76 | 618 | $6.30 \times 10^{17}$ | $6.30 \times 10^{17}$ |
| #33 | Third production method | No(Good) | 87 | 676 | $2.96 \times 10^{18}$ | $2.96 \times 10^{18}$ |
| #34 | Third production method | No(Good) | 60 | 558 | $1.06 \times 10^{20}$ | $1.06 \times 10^{20}$ |
| #35 | Third similar production method | Yes(Poor) | 17 | 652 | | |
| #36 | Third similar production method | Yes(Poor) | 17 | 657 | | |
| #37 | Third similar production method | Yes(Poor) | 24 | 630 | | |
| #38 | Third similar production method | Yes(Poor) | 32 | 633 | | |
| #39 | Third similar production method | Yes(Poor) | 75 | 680 | $1.18 \times 10^{21}$ | $1.18 \times 10^{21}$ |

TEMPLATE FOR EPITAXIAL GROWTH, METHOD FOR PRODUCING THE SAME, AND NITRIDE SEMICONDUCTOR DEVICE

TECHNICAL FIELD

The present invention relates to a template for epitaxial growth as an underlying substrate where a GaN-family compound semiconductor layer (general formula: $Al_xGa_yIn_{1-x-y}N$) is epitaxially grown and a method for producing the same, and also relates to a GaN-family nitride semiconductor device.

BACKGROUND ART

GaN-family nitride semiconductor devices such as light-emitting diodes and semiconductor lasers are conventionally produced by growing a multi-layered GaN-family compound semiconductor layer on a template for epitaxial growth (for example, see Non-patent Document 1). FIG. 7 illustrates a typical crystal layer structure of a conventional GaN-family light-emitting diode. The light-emitting diode shown in FIG. 7 has a laminated structure. In the structure, after an underlying layer 102 of AlN is formed on a sapphire substrate 101 and then a cyclic groove pattern is formed thereon by photolithography and reactive ion etching, an ELO-AlN layer 103 is formed; plus an n-type clad layer 104 of n-type AlGaN having a thickness of 2 μm, an AlGaN/GaN multi-quantum well active layer 105, a p-type AlGaN electron block layer 106 having a higher Al composition ratio than the multi-quantum well active layer 105 and having a thickness of 20 nm, a p-type clad layer 107 of p-type AlGaN having a thickness of 50 nm, and a p-type GaN contact layer 108 having a thickness of 20 nm are sequentially stacked on the ELO-AlN layer 103. The multi-quantum well active layer 105 has a multi-layered structure including five stacking layers including a GaN well layer of 2 nm in thickness that is sandwiched with AlGaN barrier layers of 8 nm in thickness. After crystal growth, in order to expose a portion of the surface of the n-type clad layer 104, the multi-quantum well active layer 105, the electron block layer 106, the p-type clad layer 107, and the contact layer 108 thereon are etched off. A p-electrode 109 of Ni/Au is formed on the surface of the contact layer 108, for example, and an n-electrode 110 of Ti/Al/Ti/Au is formed on the surface of the exposed n-type clad layer 104, for example. By making a GaN well layer into an AlGaN well layer and changing the Al composition ratio or the thickness of the AlGaN well layer, the emission wavelength is shortened, or by adding In to the layer, the emission wavelength is lengthened, thus providing a light-emitting diode in an ultraviolet region having a wavelength of about 200 nm to 400 nm. Semiconductor lasers may be produced similarly. In the crystal layer structure shown in FIG. 7, a template for epitaxial growth is formed of the sapphire substrate 101, the AlN underlying layer 102, and the ELO-AlN layer 103.

The crystal quality of the template surface directly affects the crystal quality of the GaN-family compound semiconductor layer formed thereon, providing significant effects on the characteristics of a light-emitting device or the like which is formed as a result. In providing a light-emitting diode or a semiconductor laser in the ultraviolet region, it is particularly desirable to use a template having a reduced threading dislocation density of $10^7/cm^2$ or less or preferably about $10^6/cm^2$. When the ELO-AlN layer 103 is epitaxially grown by an epitaxial lateral overgrowth (ELO) method on the AlN underlying layer 102 having a cyclic groove pattern as shown in FIG. 7, the AlN layer grown from the flat surfaces of the protrusions between the grooves overgrows laterally so as to cover over the tops of the grooves, and at the same time, the threading dislocation grown from the flat surfaces concentrates above the grooves due to the lateral overgrowth, so that the threading dislocation density is reduced significantly.

However, for the template including the sapphire substrate, the AlN underlying layer, and the ELO-AlN layer as shown in FIG. 7, it is necessary to remove a sample (substrate) once from a reaction chamber for an epitaxial growth after the AlN underlying layer is grown, and to form a cyclic groove pattern on the surface of the AlN underlying layer by photolithography and reactive ion etching. Thus, the AlN underlying layer and the ELO-AlN layer cannot be grown continuously, and the manufacturing process becomes complex and the throughput decreases, thereby increasing manufacturing costs.

On the other hand, in order to prevent the complication of the manufacturing process and the decrease in throughput by omitting etching between crystal growth processes, proposed are the methods of providing a template for epitaxial growth in which a cyclic groove pattern is directly formed on the surface of the sapphire substrate by photolithography and reactive ion etching or the like, and the ELO-AlN layer is formed directly on the sapphire substrate (for example, see Patent Document 1, and Non-patent Documents 2 and 3). In order to grow an ELO-AlN layer on the grooved surface of a substrate, it is preferable to form deeper grooves on the sapphire substrate surface since the AlN layer grown from the bottom of the grooves needs to be separate from the AlN layer laterally overgrown from the flat surfaces of the protrusions between the grooves. However, the sapphire substrate has a low etching rate and is difficult to process, so that an ELO-AlN layer having a low threading dislocation density needs to be grown on a shallow-grooved substrate.

When an AlN layer is grown on a sapphire substrate without using a lateral overgrowth method, problems solved by using the lateral overgrowth method become apparent. Thus, it is very difficult to produce a template having no cracks, a reduced threading dislocation density, and a good morphology of crystal surface.

As a method for producing a template having no cracks, a reduced threading dislocation density, and a good morphology of crystal surface by growing an AlN layer on a sapphire substrate without using a lateral overgrowth method, for example, there is suggested a method for forming a multi-layered structure by alternately laminating a pulse flow AlN layer grown by continuously supplying TMA (trimethylaluminum) as a material of Al and intermittently supplying $NH_3$ (ammonia) as a material of N and a continuous AlN layer grown by continuously supplying TMAl and $NH_3$ (see Non-patent Document 4).

PRIOR ART DOCUMENTS

Patent Document

Patent Document 1: Japanese Patent No. 3455512

Non-Patent Document

Non-patent Document 1: Kentaro Nagamatsu, et al., "High-efficiency AlGaN-based UV light-emitting diode on laterally overgrown AlN", Journal of Crystal Growth, 310, pp. 2326-2329, 2008

Non-patent Document 2: K. Nakano, et al., "Epitaxial lateral overgrowth of AlN layers on patterned sapphire substrates", phys. stat. sol. (a) 203, No. 7, pp. 1632-1635, 2006

Non-patent Document 3: J. Mei, et al., "Dislocation generation at the coalescence of aluminum nitride lateral epitaxy on shallow-grooved sapphire substrates", Applied Physics Letters 90, 221909, 2007

Non-patent Document 4: H. Hirayama, et al., "222-282 nm AlGaN and InAlGaN-based deep-UV LEDs fabricated on high-quality AlN on sapphire", Phys. Status Solidi A 206, No. 6, 1176-1182 (2009)

SUMMARY OF THE INVENTION

Problems to be Solved by the Invention

As described above, in a template formed by growing an AlN layer on a sapphire substrate by a lateral overgrowth method, it is required to form a groove pattern by etching on an underlying layer such as a sapphire substrate or an ELO-AlN layer. Regardless of an object on which the groove pattern is formed, there is a problem concerning the formation of the groove pattern.

In the method disclosed in Non-patent Document 4, it is possible to produce a template having no cracks, a reduced threading dislocation density, and a good morphology of crystal surface by growing an AlN layer on a sapphire substrate without using a lateral overgrowth method. However, it is necessary to form a multi-layered structure by growing, while by controlling a method for supplying $NH_3$, an AlN nucleation layer and an AlN burying layer for facilitating lateral overgrowth to bury a small projection of the AlN nucleation layer, growing an AlN layer thereon at a high speed by continuously supplying a material, and repeatedly laminating the three layers. This makes control during growth of the AlN layer complicated.

The present invention has been made in consideration of these problems, and an object thereof is to provide a method for producing a template for epitaxial growth having a structure including a sapphire substrate and an AlN layer grown on the sapphire substrate in a manner such that the AlN layer is easily grown without using a lateral overgrowth method or complicated growth control, and to produce a template having no cracks, a reduced threading dislocation density, and a good morphology of crystal surface.

Means for Solving the Problems

The present inventors have intensively studied and found the following matter: before or at the time of the start of growth of an AlN layer, a small amount of Ga atoms are dispersed on a surface of a sapphire substrate and the Ga concentration in a region near an interface between the substrate and the AlN layer is within a predetermined range, so that it is possible to produce a template having no cracks, a reduced threading dislocation density, and a good morphology of crystal surface by growing an AlN layer on the substrate without using a lateral overgrowth method or a complicated material supply method, and completed the present invention.

In order to achieve the above object, the present invention provides a method for producing a template having an AlN layer on a surface of a sapphire substrate and used as an underlayer for epitaxially growing a GaN-family compound semiconductor layer, the method comprising:

a surface treatment step of dispersing Ga atoms on a surface of a sapphire substrate; and an AlN growth step of epitaxially growing an AlN layer on the sapphire substrate, wherein in a Ga concentration distribution in a depth direction perpendicular to the surface of the sapphire substrate in an internal region of the AlN layer excluding a near-surface region up to a depth of 100 nm from a surface of the AlN layer, which is obtained by secondary ion mass spectrometry, a position in the depth direction where the Ga concentration takes the maximum value is present in a near-interface region located between the interface of the sapphire substrate and a position at 400 nm spaced apart from the interface to the AlN layer side, and the maximum value of the Ga concentration is $3 \times 10^{17}$ atoms/cm$^3$ or more and $2 \times 10^{20}$ atoms/cm$^3$ or less.

Moreover, according to a preferable aspect of the method for producing a template having the above characteristics, in the surface treatment step, a compound as a material of Ga is supplied to a growth chamber for performing the AlN growth step.

Furthermore, according to a preferable aspect of the method for producing a template having the above characteristics, the AlN growth step is started at any of the following timings: after the completion of the surface treatment step, simultaneously with the start of the surface treatment step, or in the middle of the surface treatment step.

According to a preferable aspect of the method for producing a template having the above characteristics, a primary ion species used in the secondary ion mass spectrometry is $O_2^+$.

Additionally, in order to achieve the above object, the present invention provides a template for epitaxial growth comprising: a sapphire substrate having Ga atoms dispersed on a surface thereof; and an AlN layer epitaxially grown on the sapphire substrate, wherein in a Ga concentration distribution in a depth direction perpendicular to the surface of the sapphire substrate in an internal region of the AlN layer excluding a near-surface region up to a depth of 100 nm from the surface of the AlN layer, which is obtained by secondary ion mass spectrometry, a position in the depth direction where the Ga concentration takes the maximum value is present in a near-interface region located between the interface of the sapphire substrate and a position at 400 nm spaced apart from the interface to the AlN layer side, and the maximum value of the Ga concentration is $3 \times 10^{17}$ atoms/cm$^3$ or more and $2 \times 10^{20}$ atoms/cm$^3$ or less.

Moreover, according to a preferable aspect of the template for epitaxial growth having the above characteristics, a primary ion species used in the secondary ion mass spectrometry is $O_2^+$.

Furthermore, the present invention provides a nitride semiconductor device comprising: the template for epitaxial growth having the above characteristics; and at least one GaN-family compound semiconductor layer epitaxially grown on the template.

Effect of the Invention

According to the template for epitaxial growth having the above characteristics and the method for producing the same, a template having no cracks, a reduced threading dislocation density, and a good morphology of crystal surface is easily obtained as an underlayer for epitaxially growing a GaN-family compound semiconductor layer without using a lateral overgrowth method or a complicated material supply method.

The reason for the above-noted effect is not clear, but it is surmised as described below. Before the lattice mismatching between the sapphire substrate and the AlN causes a local stress concentration on the surface of the sapphire substrate and cracks occur, a small and appropriate amount of Ga atoms dispersed on the surface of the sapphire substrate serve as a nucleus to distribute the stress. As a result, the occurrence of cracks is suppressed.

As a result, a GaN-family compound semiconductor layer of high crystal quality is stably provided as a layer formed on the template for epitaxial growth having the above characteristics without increasing manufacturing costs, and thus a semiconductor device having the GaN-family compound semiconductor layer will have superior properties.

BRIEF DESCRIPTION OF THE DRAWINGS

FIG. 4 is a list collectively showing a plurality of measurement results of surface morphologies of template samples which are produced by the methods for producing a template for epitaxial growth according to the present invention and production methods similar thereto.

MODE FOR CARRYING OUT THE INVENTION

The following describes embodiments of a method for producing a template for epitaxial growth (hereinafter, sometimes referred to as the "present production method") according to the present invention and a template for epitaxial growth included in a nitride semiconductor device (hereinafter, sometimes referred to as the "present template") according to the present invention with reference to the drawings.

Figure 1A:
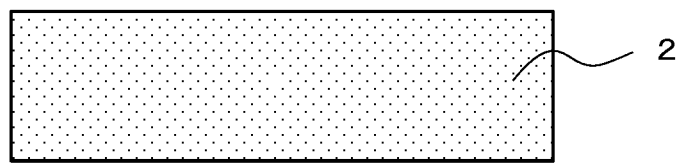
FIGS. 1A, 1B and 1C are cross-sectional flow diagrams, each schematically illustrating a flow of Example 1 of a method for producing a template for epitaxial growth according to the present invention.
Figure 1B:
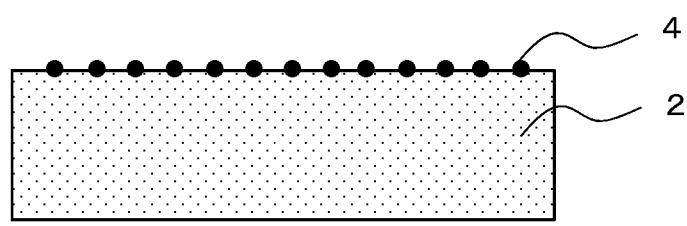
Figure 1C:
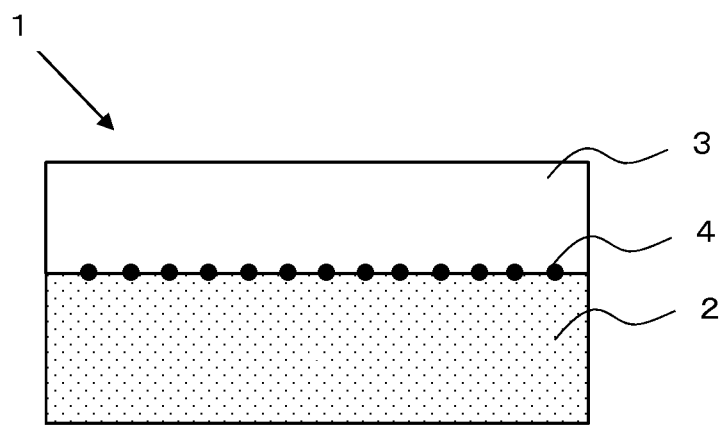
Figure 2A:
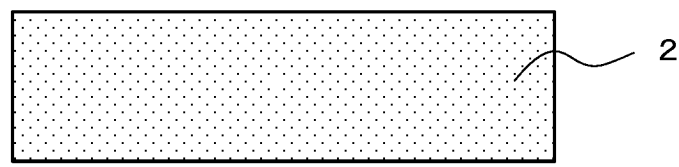
FIGS. 2A, 2B, 2C and 2D are cross-sectional flow diagrams, each schematically illustrating a flow of Example 2 of a method for producing a template for epitaxial growth according to the present invention.
Figure 2B:
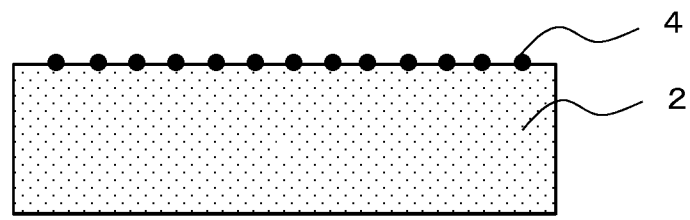
Figure 2C:
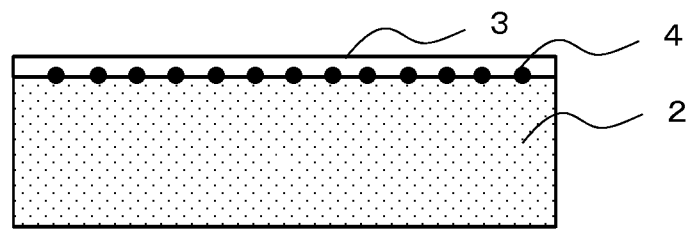
Figure 2D:
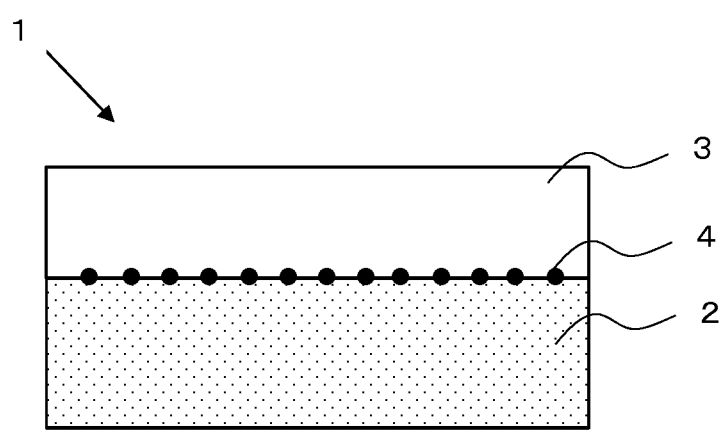
Figure 3A:
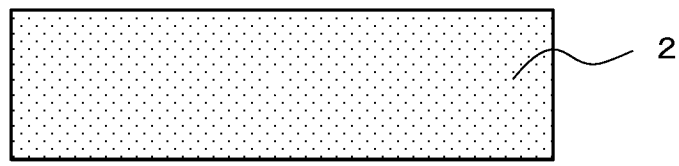
FIGS. 3A, 3B and 3C are cross-sectional flow diagrams, each schematically illustrating a flow of Example 3 of a method for producing a template for epitaxial growth according to the present invention.
Figure 3B:
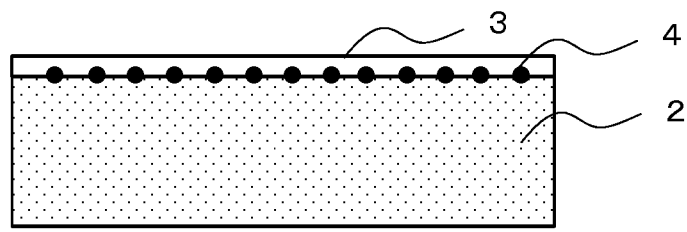
Figure 3C:
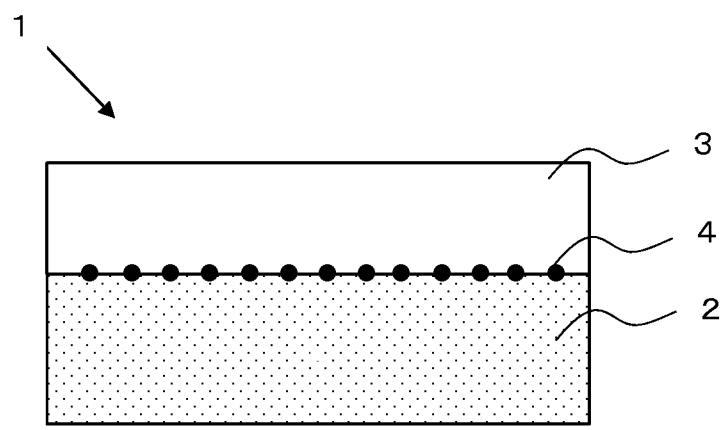

FIGS. 1A to 1C show cross-sectional flow diagrams, each schematically illustrating a flow of Example 1 of the present production method (hereinafter referred to as the "first production method"), FIGS. 2A to 2D show cross-sectional flow diagrams, each schematically illustrating a flow of Example 2 of the present production method (hereinafter referred to as the "second production method"), and FIGS. 3A to 3C show cross-sectional flow diagrams, each schematically illustrating a flow of Example 3 of the present production method (hereinafter referred to as the "third production method"). The drawings show cross sections during and after the production of the present template. In FIGS. 1 to 3, essential parts are exaggerated to facilitate understanding of the description, and the proportion of parts in the drawings is not necessarily actual.

In any of the first to third production methods, a sapphire substrate 2 is first prepared and housed in a reaction chamber (not shown) for epitaxially growing an AlN layer 3 (see FIGS. 1A, 2A, and 3A). In this embodiment, the AlN layer 3 is epitaxially grown by a well-known metalorganic vapor phase epitaxy (MOVPE).

In the first production method, TMG (trimethylgallium) as a material (precursor) of Ga for MOVPE is then supplied to the reaction chamber at a predetermined flow rate and a predetermined time, and Ga atoms 4 are dispersed on the surface of the sapphire substrate 2 (surface treatment step: see FIG. 1B). Further, the AlN layer 3 is epitaxially grown on the sapphire substrate 2 whose surface is supplied with the Ga atoms 4 by well-known MOVPE (AlN growth step: see FIG. 1C). In the AlN growth step of the first production method, the supply of TMG is stopped through the treatment period.

In the second production method, TMG (trimethylgallium) as a material (precursor) of Ga for MOVPE is then supplied to the reaction chamber at a predetermined flow rate and a predetermined time, and Ga atoms 4 are dispersed on the surface of the sapphire substrate 2 (surface treatment step: see FIGS. 2B and 2C). The second production method differs from the first production method in that the epitaxial growth of the AlN layer 3 on the sapphire substrate 2 whose surface is supplied with the Ga atoms 4 is started in the middle of the surface treatment step by well-known MOVPE (AlN growth step: see FIGS. 2C and 2D). Therefore, in the second production method, a period before the completion of the surface treatment step is overlapped with a period after the start of the AlN growth step (see FIG. 2C). After the completion of the surface treatment step, the supply of TMG is stopped.

In the third production method, TMG (trimethylgallium) as a material (precursor) of Ga for MOVPE is then supplied to the reaction chamber at a predetermined flow rate and a predetermined time, and Ga atoms 4 are dispersed on the surface of the sapphire substrate 2 (surface treatment step: see FIG. 3B). The third production method differs from the first and second production methods in that the AlN layer 3 is epitaxially grown on the sapphire substrate 2 whose surface is supplied with the Ga atoms 4 by well-known MOVPE simultaneously with the start of the surface treatment step (AlN growth step: see FIGS. 3B and 3C). Therefore, in the third production method, an entire period of the surface treatment step is overlapped with a period after the start of the AlN growth step (see FIG. 3B). After the completion of the surface treatment step, the supply of TMG is stopped.

As shown in FIGS. 1C, 2D, and 3C, the present template 1 includes a sapphire (0001) substrate 2 and an AlN layer 3. Ga atoms 4 are dispersed on the surface of the sapphire substrate 2. Some of the Ga atoms 4 are diffused to some extent from the surface of the sapphire substrate 2 to the inside of the AlN layer 3. According to any of the first to third production methods, in the concentration distribution in the depth direction (direction perpendicular to the surface of the sapphire substrate 2) of the Ga concentration in an internal region excluding a near-surface region up to a depth of 100 nm from the surface in the AlN layer 3, a position in the depth direction where the Ga concentration takes the maximum value is present in a near-interface region located from an interface between the sapphire substrate 2 and the AlN layer 3 to a position at about 400 nm spaced apart from the interface to the AlN layer 3 side. The supply of TMG (e.g., flow rate and time) is adjusted so that the maximum value of the Ga concentration is within a preferable range $3 \times 10^{17}$ atoms/cm$^3$ or more and $2 \times 10^{20}$ atoms/cm$^3$ or less. The maximum value of the Ga concentration is as low as the impurity concentration with respect to the AlN layer 3. This is not a level where a uniform AlGaN layer is clearly formed near the interface with the sapphire substrate 2 in the AlN layer 3.

Thus, a template for epitaxial growth having a fine and flat surface and no cracks (the present template 1) is provided by the present production method.

The thickness of the AlN layer 3 is, for example, about 1 μm to 10 μm. The growth temperature in the AlN growth step is set higher (for example, at 1230° C. to 1350° C.) than the crystallization temperature of AlN. The pressure is set about 50 Torr or less. In this embodiment, TMA (trimethylaluminum) and NH$_3$ (ammonia) as the materials (precursors) of Al and N are continuously supplied within the range of a predetermined flow ratio (NH$_3$/TMA). Since the optimal value of each of the above setting conditions varies depending on the device such as a reaction chamber to be used, it is appropriately adjusted in accordance with the device to be used.

In the second and third production methods, the temperature and pressure conditions in the surface treatment step are similar to those in the AlN growth step. In the first and second production methods, the temperature and pressure conditions prior to the AlN growth step may be similar to those in the AlN growth step. For example, the pressure may be set about 100 Torr instead, which is higher than that in the AlN growth step.

Regarding the samples of the present templates 1 produced by the first to third production methods and the samples produced by similar production methods which are different from the first to third production methods only in terms of TMG supply condition in the surface treatment step (the first to third similar production methods), the evaluation results of the surface morphology will be described below with reference to the drawings. The samples produced by the first to third production methods have good surface morphologies. They are good quality samples in which the maximum value of the Ga concentration is within the preferable range of $3 \times 10^{17}$ atoms/cm$^3$ to $2 \times 10^{20}$ atoms/cm$^3$. The samples produced by the similar production methods are poor samples whose surface morphology is poor due to occurrence of cracks and in which the maximum value of the Ga concentration is out of the preferable range (less than $3 \times 10^{17}$ atoms/cm$^3$ or more than $2 \times 10^{20}$ atoms/cm$^3$). For the convenience of explanation, the first production method and the first similar production method are collectively referred to as the "first method," the second production method and the second similar production method are collectively referred to as the "second method," and the third production method and the third similar production method are collectively referred to as the "third method."

In this embodiment, the Ga concentration in the AlN layer 3 is measured by the secondary ion mass spectrometry. In this regard, an oxygen ion (O$_2^+$) is used as the primary ion species. Generally, in ion mass spectrometry, a cesium ion (Cs+) or an oxygen ion (O$_2^+$) is used as the primary ion species. In this embodiment, an oxygen ion that reduces the background level of Ga in AlN is used. When the primary ion species is a cesium ion, the background level of Ga in AlN is $2 \times 10^{17}$ to $3 \times 10^{17}$ atoms/cm$^3$. Thus, it is impossible to accurately measure the Ga concentration around the lower limit of the preferable range of the maximum value of the Ga concentration or lower than the lower limit. On the other hand, when the primary ion species is an oxygen ion, the background level of Ga in AlN is less than $1 \times 10^{17}$ atoms/cm$^3$ (about 4 to $8 \times 10^{16}$ atoms/cm$^3$). Thus, it is possible to accurately measure the Ga concentration around the lower limit of the preferable range or lower than the lower limit.

The maximum value of the Ga concentration in the AlN layer 3 is calculated excluding the near-surface region up to a depth of 100 nm from the surface of the AlN layer 3. This is because the Ga concentration in the near-surface region which is measured by the secondary ion mass spectrometry may not be accurately measured due to influences of substances such as oxides adhered to the surface of the AlN layer 3 and the charge-up of the surface.

As a standard for specifying the above-noted near-interface region, the depth (position in the depth direction) of the interface between the sapphire substrate 2 and the AlN layer 3 can be grasped from the nitrogen concentration measured by the secondary ion mass spectrometry, because of large changes in the nitrogen concentration at the interface. However, an error (about several 10 nm to 100 nm) may occur in the depth of the interface due to a matrix effect. Thus, in this embodiment, the near-interface region is 400 nm long, which is longer than the error, and the maximum value of the Ga concentration is used as a standard for evaluation. Accordingly, even if the interface position for specifying the near-interface region is shifted to the inside of the sapphire substrate 2 due to the error and the Ga concentration at the interface is seemingly a low value, it is possible to correctly evaluate the relationship between the Ga concentration in the near-interface region and the surface morphology of the present template 1.

FIG. 4 shows the measurement results of the full widths at half maximum FWHM (arcsec): tilt distribution (ω mode) and twist distribution (φ mode), which were obtained by analyzing respective surfaces of samples #11 to #17 produced by the first method, samples #21 to #23 produced by the second method, and samples #31 to #39 produced by the third method (all of the samples are 2-inch wafers) by the X-ray rocking curve (XRC) method, the results of visual examination of the presence of cracks, and the results of the Ga concentration measurement that was performed on some samples selected from good quality samples having no cracks and poor samples having cracks among the above-noted samples. The Ga concentration values in FIG. 4 show the maximum values of the Ga concentration in the internal region of the AlN layer 3 excluding the near-surface region and the maximum values of the Ga concentration in the near-interface region. In the Ga concentration measurement shown in FIG. 4, the nitrogen concentration measurement is not performed. Thus, the position of the interface between the sapphire substrate 2 and the AlN layer 3 is estimated from changes in the concentration of Ga. Specifically, the set interface position is the deepest position that is one-half or more of the maximum value of the Ga concentration in the near-interface region determined by the interface position temporarily set by visual observation from the Ga concentration distribution graph.

In the surface treatment step (the first method) of each of the samples #11 to #17, TMG was supplied at a flow rate ranging from 0.005 sccm to 0.1 sccm for 30 seconds. In the surface treatment step (the second method) of each of the samples #21 to #23, TMG was supplied at a flow rate ranging from 0.005 sccm to 0.4 sccm for 30 seconds before the start of the AlN growth step, and TMG was supplied at a flow rate ranging from 0.005 sccm to 0.1 sccm for 1 minute or 10 minutes after the start of the AlN growth step. In the surface treatment step (the third method) of each of the samples #31 to #39, TMG was supplied at a flow rate ranging from 0.005 sccm to 20 sccm for 1 minute or 10 minutes. In each of the samples, the AlN growth rate in the AlN growth step is about 1.2 μm/h, and the target thickness of the AlN layer 3 is 2 μm. However, the actual thickness of the AlN layer 3 varies to some extent among the samples. In the surface treatment step of each of the samples #21 to #23 and the samples #31 to #39, during the overlap with the AlN growth step of 1 minute or 10 minutes, the AlN layer 3 grows at a growth rate of about 1.2 μm/h. Therefore, the thickness of the layer grown in the period is about 20 nm or about 200 nm. The grown part of the AlN layer 3 is present in the near-interface region.

The results shown in FIG. 4 indicate that, within the adjustable range of the above-noted supply of TMG, good quality samples having no cracks and poor samples having cracks are present in any of the first to third methods. Generally, a sample having a low full width at half maximum FWHM of twist distribution significantly tends to be a good quality sample having no cracks. Concerning the full width at half maximum FWHM of tilt distribution, there is no correlation with the presence or absence of cracks.

Figure 5:
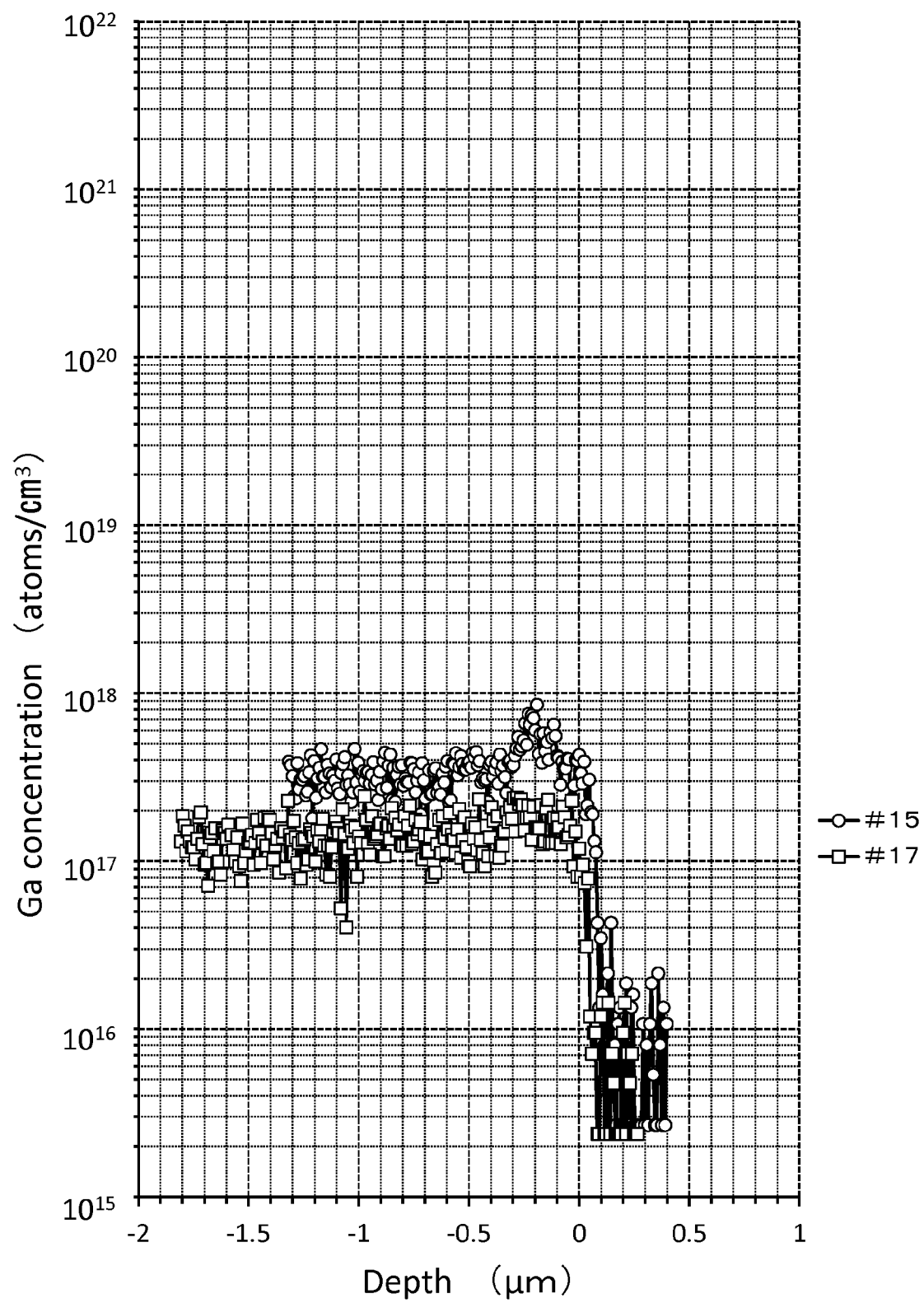
FIG. 5 is a diagram showing Ga concentration distributions of samples #15 and #17 among samples shown in FIG. 4.
Figure 6:
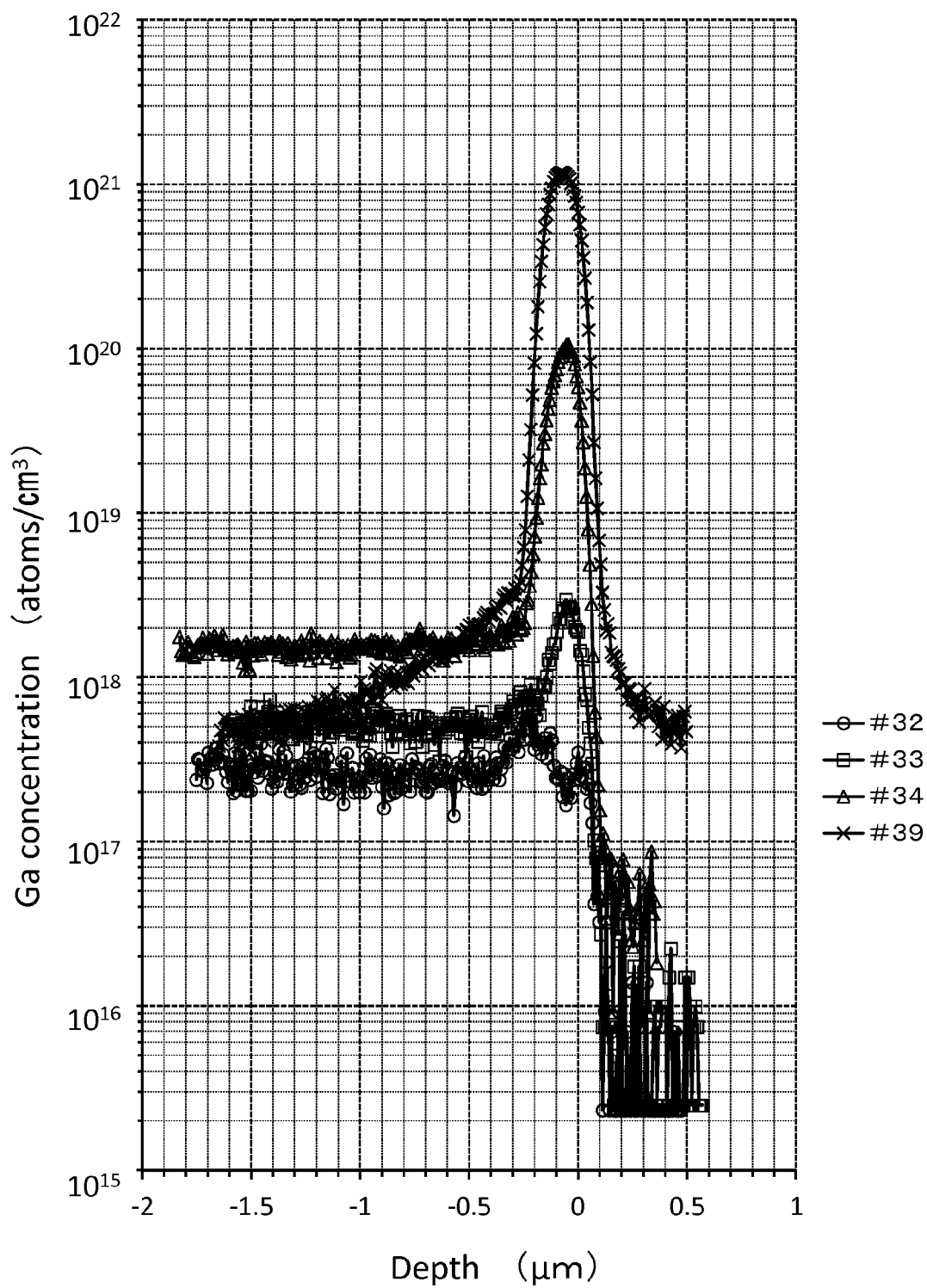
FIG. 6 is a diagram showing Ga concentration distributions of samples #32 to #34 and #39 among samples shown in FIG. 4.

Subsequently, the secondary ion mass spectrometry results of the Ga concentration distribution in the depth direction of the AlN layer 3 (direction perpendicular to the surface of the sapphire substrate 2) regarding the sample #15 (good quality sample) of the samples produced by the first production method, the sample #17 (poor sample) produced by the first similar production method, the samples #32 to #34 (good quality samples) of the samples produced by the third production method, and the sample #39 (poor sample) produced by the third similar production method will be described with reference to FIGS. 5 and 6. FIG. 5 shows the Ga concentration distribution in the region excluding the above-noted near-surface region as for the samples #15 and #17. FIG. 6 shows the Ga concentration distribution in the region excluding the above-noted near-surface region as for the samples #32 to #34 and #39. In FIGS. 5 and 6, each horizontal axis indicates the depth of the AlN layer 3 and the sapphire substrate 2 (position in the depth direction). The origin (0 μm) indicates the position of the interface between the sapphire substrate 2 and the AlN layer 3 which is calculated from changes in the above-noted Ga concentration. Since a positive direction is the direction toward the sapphire substrate 2, the depth at the side of the AlN layer 3 is shown in a negative value and the depth at the side of the sapphire substrate 2 is shown in a positive value. The position in the near-surface region of the AlN layer 3 of each of the samples varies depending on variations in the position of the interface and variations in the actual thickness of the AlN layer 3 among the samples.

In the samples #15 and #17 produced by the first method, the supply of TMG before the AlN growth step is suppressed in each case. The flow rate of the sample #15 is set 5 times as high as that of the sample #17.

As shown in FIGS. 4 and 5, the sample #15 (good quality sample) is a good quality sample having no cracks in which the Ga concentration distribution in the internal region of the AlN layer 3 is within the range of about $1.34 \times 10^{17}$ atoms/cm$^3$ to $8.54 \times 10^{17}$ atoms/cm$^3$, the Ga concentration distribution in the near-interface region is within the range of about $2.28 \times 10^{17}$ atoms/cm$^3$ to $8.54 \times 10^{17}$ atoms/cm$^3$, the maximum value of the Ga concentration in the internal region of the AlN layer 3 (about $8.45 \times 10^{17}$ atoms/cm$^3$) is located in the near-interface region, exceeds the lower limit of the preferable range ($3 \times 10^{17}$ to $2 \times 10^{20}$ atoms/cm$^3$), and is located close to the lower limit of the preferable range. In the sample #15, the Ga concentration in the internal region of the AlN layer 3 is high on average in the near-interface region, compared to that in the region except for the near-interface region. In other words, the Ga atoms are mostly present near the interface between the sapphire substrate 2 and the AlN layer 3.

On the other hand, as shown in FIGS. 4 and 5, since the supply of TMG of the sample #17 (poor sample) is less than that of the sample #15, the sample #17 is a poor sample with cracks in which the Ga concentration distribution in the internal region of the AlN layer 3 is within the range of about $4.04 \times 10^{16}$ atoms/cm$^3$ to $2.42 \times 10^{17}$ atoms/cm$^3$, the Ga concentration distribution in the region near the interface is within the range of about $8.08 \times 10^{16}$ atoms/cm$^3$ to $2.38 \times 10^{17}$ atoms/cm$^3$, the maximum value of the Ga concentration in the internal region of the AlN layer 3 (about $2.42 \times 10^{17}$ atoms/cm$^3$) is less than the lower limit of the preferable range ($3 \times 10^{17}$ to $2 \times 10^{20}$ atoms/cm$^3$), and is out the preferable range, and is not located in the near-interface region. In the sample #17, the Ga concentration distribution is nearly flat in the whole internal region of the AlN layer 3. This is not a state where the Ga atoms are mostly present near the interface between the sapphire substrate 2 and the AlN layer 3.

In the samples #32 to #34 and #39 produced by the third method, the supply of TMG in the surface treatment step is significantly changed so that the maximum value of the Ga concentration in the AlN layer 3 is a value slightly higher than the lower limit of the preferable range ($3 \times 10^{17}$ to $2 \times 10^{20}$ atoms/cm$^3$), a value slightly lower than the upper limit of the preferable range or a value higher than the upper limit of the preferable range. Specifically, the supply of TMG is increased in order of the samples #32, #33, #34, and #39.

As shown in FIGS. 4 and 6, the sample #32 (good quality sample) is a good quality sample having no cracks in which the Ga concentration distribution in the internal region of the AlN layer 3 is within the range of about $1.44 \times 10^{17}$ atoms/cm$^3$ to $6.30 \times 10^{17}$ atoms/cm$^3$, the Ga concentration distribution in the near-interface region is within the range of about $1.67 \times 10^{17}$ atoms/cm$^3$ to $6.30 \times 10^{17}$ atoms/cm$^3$, the maximum value of the Ga concentration in the internal region of the AlN layer 3 (about $6.30 \times 10^{17}$ atoms/cm$^3$) is located in the near-interface region, exceeds the lower limit of the preferable range ($3 \times 10^{17}$ to $2 \times 10^{20}$ atoms/cm$^3$), and is located close to the lower limit of the preferable range. In the sample #32, the Ga concentration in the internal region of the AlN layer 3 is high on average in the near-interface region, compared to that in the region except for the near-interface region. In other words, the Ga atoms are mostly present near the interface between the sapphire substrate 2 and the AlN layer 3.

As shown in FIGS. 4 and 6, the sample #33 (good quality sample) is a good quality sample having no cracks in which the Ga concentration distribution in the internal region of the AlN layer 3 is within the range of about $3.08 \times 10^{17}$ atoms/cm$^3$ to $2.96 \times 10^{18}$ atoms/cm$^3$, the Ga concentration distribution in the near-interface region is within the range of about $4.52 \times 10^{17}$ atoms/cm$^3$ to $2.96 \times 10^{18}$ atoms/cm$^3$, the maximum value of the Ga concentration in the internal region of the AlN layer 3 (about $2.96 \times 10^{18}$ atoms/cm$^3$) is located in the near-interface region, is about 10 times the lower limit of the preferable range ($3 \times 10^{17}$ to $2 \times 10^{20}$ atoms/cm$^3$), and is located at the lower side from the center of the preferable range. In the sample #33, the Ga concentration in the internal region of the AlN layer 3 is high on average in the near-interface region, compared to that in the region except for the near-interface region. In other words, the Ga atoms are mostly present near the interface between the sapphire substrate 2 and the AlN layer 3.

As shown in FIGS. 4 and 6, the sample #34 (good quality sample) is a good quality sample having no cracks in which the Ga concentration distribution in the internal region of the AlN layer 3 is within the range of about $1.09 \times 10^{18}$ atoms/cm$^3$ to $1.06 \times 10^{20}$ atoms/cm$^3$, the Ga concentration distribution in the near-interface region is within the range of about $1.59 \times 10^{18}$ atoms/cm$^3$ to $1.06 \times 10^{20}$ atoms/cm$^3$, the maximum value of the Ga concentration in the internal region of the AlN layer 3 (about $1.06 \times 10^{20}$ atoms/cm$^3$) is located in the near-interface region, is less than the upper limit of the preferable range ($3 \times 10^{17}$ to $2 \times 10^{20}$ atoms/cm$^3$), and is located close to the upper limit of the preferable range. In the sample #34, the Ga concentration in the internal region of the AlN layer 3 is high on average in the near-interface region, compared to that in the region except for the near-interface region. In other words, the Ga atoms are mostly present near the interface between the sapphire substrate 2 and the AlN layer 3.

As shown in FIGS. 4 and 6, the sample #39 (poor sample) is a poor sample with cracks in which the Ga concentration distribution in the internal region of the AlN layer 3 is within the range of about $3.52 \times 10^{17}$ atoms/cm$^3$ to $1.18 \times 10^{21}$ atoms/cm$^3$, the Ga concentration distribution in the near-interface region is within the range of about $2.42 \times 10^{18}$ atoms/cm$^3$ to $1.18 \times 10^{21}$ atoms/cm$^3$, the maximum value of the Ga concentration in the internal region of the AlN layer 3 (about $1.18 \times 10^{21}$ atoms/cm$^3$) is located in the near-interface region, but exceeds the upper limit of the preferable range ($3 \times 10^{17}$ to $2 \times 10^{20}$ atoms/cm$^3$) and is out the preferable range. In the sample #39, the Ga concentration in the internal region of the AlN layer 3 is higher in the near-interface region, and the concentration is about 10 times as high as that of the good quality sample #34.

The measurement results of Ga concentration shown in FIGS. 4 to 6 indicate the following: In order to obtain a good quality sample having no cracks, it is important that Ga atoms are present near the interface between the sapphire substrate 2 and the AlN layer 3 in an appropriate concentration distribution, and thus the Ga atoms are dispersed on or near the surface of the sapphire substrate. Therefore, it is important to supply Ga atoms to the surface of the sapphire substrate before or simultaneously with the growth of the AlN layer 3. More specifically, it is necessary that the maximum value of the Ga concentration in an internal region excluding the near-surface region of the AlN layer 3 is within the preferable range of $3 \times 10^{17}$ atoms/cm$^3$ to $2 \times 10^{20}$ atoms/cm$^3$, and the position of the maximum value is present in the near-interface region.

Further, in each of the good quality samples #15 and #32 to #34, the depth for the maximum value of the Ga concentration in the internal region of the AlN layer 3 is indeed in the near-interface region. A more detailed observation shows that the depth is present in a region closer to the interface that is located from the interface between the sapphire substrate 2 and the AlN layer 3 to a position at about 300 nm spaced apart from the interface to the side of the AlN layer 3. Even if the determined interface position has an error of about 100 nm, the depth for the maximum value of the Ga concentration is certainly present in the near-interface region. Further, the Ga concentration distribution of each of the good quality samples #15 and #32 to #34 supports the fact that Ga atoms are mostly present in the interface between the sapphire substrate 2 and the AlN layer 3.

The lower limit of the preferable range of the maximum value of the Ga concentration may be set within the range of $3 \times 10^{17}$ atoms/cm$^3$ to $6 \times 10^{17}$ atoms/cm$^3$. For example, the lower limit of the preferable range is preferably $4 \times 10^{17}$ atoms/cm$^3$ or $5 \times 10^{17}$ atoms/cm$^3$. The upper limit of the preferable range of the maximum value of the Ga concentration may be set within the range of $1.1 \times 10^{20}$ atoms/cm$^3$ to $2 \times 10^{20}$ atoms/cm$^3$. For example, it is preferably $1.5 \times 10^{20}$ atoms/cm$^3$ or $1.2 \times 10^{20}$ atoms/cm$^3$. The lower and upper limits may be combined arbitrarily.

It has been described that, in Ga concentration distribution of the samples produced by the first production method and the good quality samples having no cracks produced by the third production method, a position in the depth direction where the Ga concentration takes the maximum value in an internal region excluding the near-surface region of the AlN layer 3 is present in the above-noted near-interface region, and the maximum value of the Ga concentration is present within the preferable range of $3 \times 10^{17}$ atoms/cm$^3$ or more and $2 \times 10^{20}$ atoms/cm$^3$ or less. In the above-noted description, the Ga concentration distribution of the sample produced by the second production method is not measured. However, in the second production method, as is clear from the above-noted description, the surface treatment step has an eclectic structure including both the surface treatment step of the first production method and the surface treatment step of the third production method, and therefore, it is obvious that when the supply of TMG is appropriately adjusted, it is possible to achieve the condition that a position in the depth direction where the Ga concentration takes the maximum value in an internal region excluding the near-surface region of the AlN layer 3 is present in the above-noted near-interface region, and the maximum value of the Ga concentration is present within the preferable range of $3 \times 10^{17}$ atoms/cm$^3$ or more and $2 \times 10^{20}$ atoms/cm$^3$ or less, similarly to the case of the first and third production methods.

The present production method and present template have been described above in detail. The characteristics of the present invention lie in an underlayer for epitaxially growing a GaN-family compound semiconductor layer including a sapphire substrate 2 and an AlN layer 3 epitaxially grown thereon, and a method for producing the same, wherein in a depth direction distribution of Ga concentration in an internal region of the AlN layer 3 excluding the near-surface region, which is obtained by secondary ion mass spectrometry, a position in the depth direction where the Ga concentration takes the maximum value is present in the near-interface region, and the maximum value of the Ga concentration is $3 \times 10^{17}$ atoms/cm$^3$ or more and $2 \times 10^{20}$ atoms/cm$^3$ or less. The above-noted production method and conditions are merely an example for description, and these conditions and the like may be appropriately modified without departing from the present invention including the above characteristics.

In the above-noted embodiments, the MOVPE method is assumed as the method of epitaxially growing the AlN layer 3. As the surface treatment step of dispersing Ga atoms 4 on the surface of the sapphire substrate 2, in the first production method, it has been described that TMG as a material (precursor) of Ga for MOVPE is supplied to the reaction chamber at a predetermined flow rate and a predetermined time before the AlN growth step. In the second production method, it has been described that the supply of the TMG is performed before and after the start of the AlN growth step. In the third production method, it has been described that the supply of the TMG is started simultaneously with the start of the AlN growth step. However, the method of epitaxially growing the AlN layer 3 is not limited to MOVPE. For example, the hydride VPE (vapor phase epitaxy) method may be applied as the epitaxial growth method. Further, the surface treatment step is not limited to the methods exemplified in the above-noted first to third production methods as long as it is a method capable of dispersing the Ga atoms 4 on the surface of the sapphire substrate 2 and satisfying the condition that the depth where the Ga concentration takes the maximum value is present in the near-interface region and the maximum value of the Ga concentration is within the preferable range. In the above-noted first to third production methods, it has been described that the surface treatment step is started after the sapphire substrate 2 is housed in the reaction chamber. However, the same effect can also be produced by, for example, previously supplying an appropriate amount of a material of Ga to the reaction chamber before housing the sapphire substrate 2 in the reaction chamber.

Figure 7:
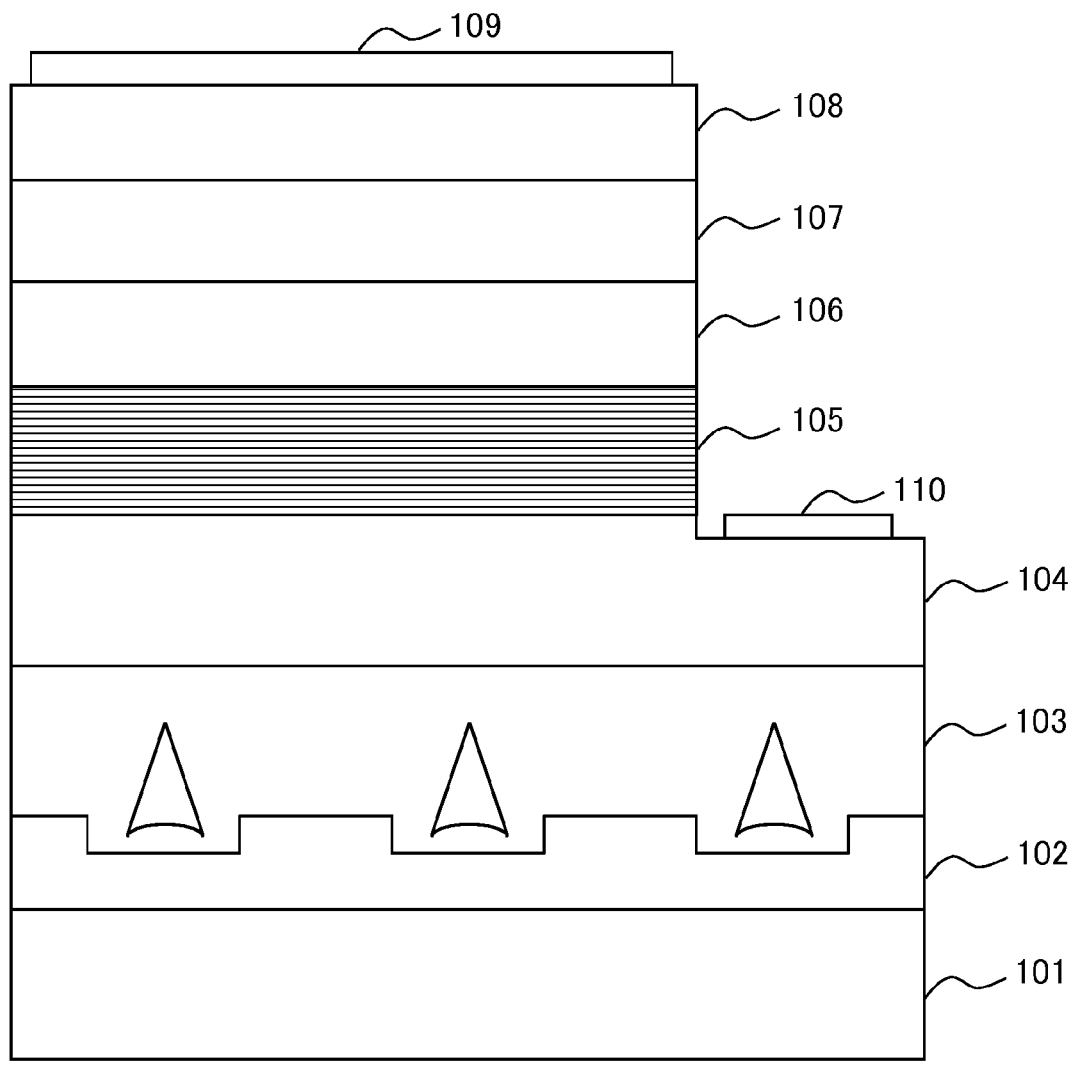
FIG. 7 is a cross-sectional diagram schematically illustrating a typical crystal layer structure of a conventional GaN-family light-emitting diode.

Subsequently, the nitride semiconductor device produced by epitaxially growing a GaN-familiy compound semiconductor layer on the present template 1 produced by the present production method will be described. Depending on the laminated structure of the GaN-family compound semiconductor layer formed on the present template 1, an element structure such as a light-emitting diode, a semiconductor laser, a switching element or an amplifying element is formed. The present nitride semiconductor device features the present template 1 used as an underlayer. The element structure formed thereon is not limited to a specific structure. In the case of the light-emitting diode, a light emitting diode as the nitride semiconductor device is produced by, for example, laminating the element structure which is the upper part above the ELO-AlN layer 103 shown in FIG. 7 (a conventional light-emitting diode), directly on the present template 1 or with another GaN-family compound semiconductor layer interposed therebetween.

INDUSTRIAL APPLICABILITY

The template for epitaxial growth and the method for producing the same according to the present invention are applicable to produce a GaN-family nitride semiconductor device such as a light-emitting diode and a semiconductor laser.

EXPLANATION OF REFERENCES

1: Template for epitaxial growth
2: Sapphire substrate
3: AlN layer
4: Ga atom

The invention claimed is:

1. A method for producing a template having an AlN layer on a surface of a sapphire substrate and used as an underlayer for epitaxially growing a GaN-family compound semiconductor layer, the method comprising:
a surface treatment step of dispersing Ga atoms on a surface of a sapphire substrate; and
an AlN growth step of epitaxially growing an AlN layer on the sapphire substrate,
wherein in a Ga concentration distribution in a depth direction perpendicular to the surface of the sapphire substrate in an internal region of the AlN layer excluding a near-surface region up to a depth of 100 nm from the surface of the AlN layer, which is obtained by secondary ion mass spectrometry,
a position in the depth direction where the Ga concentration takes a maximum value is present in a near-interface region located between the surface of the sapphire substrate and a position at 400 nm spaced apart from the surface of the sapphire substrate to the AlN layer side, and
the maximum value of the Ga concentration is $3 \times 10^{17}$ atoms/cm$^3$ or more and $2 \times 10^{20}$ atoms/cm$^3$ or less.

2. The method for producing a template according to claim 1, wherein a primary ion species used in the secondary ion mass spectrometry is $O_2^+$.

3. The method for producing a template according to claim 1, wherein the AlN growth step is started at any of the following timings: after a completion of the surface treatment step, simultaneously with a start of the surface treatment step, or in a middle of the surface treatment step.

4. The method for producing a template according to claim 3, wherein a primary ion species used in the secondary ion mass spectrometry is $O_2^+$.

5. The method for producing a template according to claim 1, wherein in the surface treatment step, a compound as a material of Ga is supplied to a growth chamber for performing the AlN growth step.

6. The method for producing a template according to claim 5, wherein a primary ion species used in the secondary ion mass spectrometry is $O_2^+$.

7. The method for producing a template according to claim 5, wherein the AlN growth step is started at any of the following timings: after a completion of the surface treatment step, simultaneously with a start of the surface treatment step, or in a middle of the surface treatment step.

8. The method for producing a template according to claim 7, wherein a primary ion species used in the secondary ion mass spectrometry is $O_2+$.

9. A template for epitaxial growth comprising:
a sapphire substrate having Ga atoms dispersed on a surface thereof; and
an AlN layer epitaxially grown on the sapphire substrate, wherein in a Ga concentration distribution in a depth direction perpendicular to the surface of the sapphire substrate in an internal region of the AlN layer excluding a near-surface region up to a depth of 100 nm from the surface of the AlN layer, which is obtained by secondary ion mass spectrometry,
a position in the depth direction where the Ga concentration takes a maximum value is present in a near-interface region located between the surface of the sapphire substrate and a position at 400 nm spaced apart from the surface of the sapphire substrate to the AlN layer side, and
the maximum value of the Ga concentration is $3 \times 10^{17}$ atoms/cm$^3$ or more and $2 \times 10^{20}$ atoms/cm$^3$ or less.

10. A nitride semiconductor device comprising:
the template for epitaxial growth according to claim 9; and
at least one GaN-family compound semiconductor layer epitaxially grown on the template.

11. The template for epitaxial growth according to claim 9, wherein a primary ion species used in the secondary ion mass spectrometry is $O_2^+$.

12. A nitride semiconductor device comprising:
the template for epitaxial growth according to claim 11; and
at least one GaN-family compound semiconductor layer epitaxially grown on the template.

* * * * *